United States Patent
Irisawa et al.

(10) Patent No.: US 7,619,239 B2
(45) Date of Patent: Nov. 17, 2009

(54) SEMICONDUCTOR DEVICE AND METHOD OF MANUFACTURING THE SAME

(75) Inventors: Toshifumi Irisawa, Tokyo (JP); Toshinori Numata, Kamakura (JP); Tsutomu Tezuka, Yokohama (JP); Naoharu Sugiyama, Yokohama (JP); Shinichi Takagi, Tsukuba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 11/437,730

(22) Filed: May 22, 2006

(65) Prior Publication Data

US 2006/0266996 A1 Nov. 30, 2006

(30) Foreign Application Priority Data

May 31, 2005 (JP) ............................. 2005-160525

(51) Int. Cl.
*H01L 29/06* (2006.01)
(52) U.S. Cl. ......................................... 257/19; 438/199
(58) Field of Classification Search .......... 257/E29.193, 257/19, 254, 417, 18, 371, 55, 63, 369, E21.182, 257/E21.207; 438/197, 219, 228, 231, 938
See application file for complete search history.

(56) References Cited

U.S. PATENT DOCUMENTS

| | | | |
|---|---|---|---|
| 6,339,232 B1 * | 1/2002 | Takagi ......................... | 257/192 |
| 6,727,550 B2 | 4/2004 | Tezuka et al. | |
| 7,115,945 B2 * | 10/2006 | Lee et al. ...................... | 257/329 |
| 7,138,309 B2 * | 11/2006 | Lee et al. ...................... | 438/197 |
| 7,160,769 B2 * | 1/2007 | White et al. ................. | 438/198 |
| 7,227,205 B2 * | 6/2007 | Bryant et al. ................ | 257/288 |
| 2005/0104131 A1 | 5/2005 | Chidambarrao et al. | |
| 2005/0156268 A1 * | 7/2005 | Chu ............................. | 257/478 |

FOREIGN PATENT DOCUMENTS

| | | |
|---|---|---|
| JP | 2001-160594 | 6/2001 |
| JP | 2003-179157 | 6/2003 |
| JP | 2003-203989 | 7/2003 |

OTHER PUBLICATIONS

Tsutomu Tezuka et al, "A Novel Fabrication Technique of Ultrathin and Relaxed SiGe Buffer Layers with High Ge Fraction for Sub-100 nm Strained Silicon-on-Insulator MOSFETs", 2001, Jpn. J. Apply. Phys., vol. 40, pp. 2866-2874.*

T. Irisawa et al, "High current drive uniaxially strained SGOI pmosfets fabricated by lateral strain relaxation technique", Jun. 14-16, 2005, Symposium on VLSI Technology Digest of Technical Papers, pp. 178-179.*

Chinese Patent Office Notification of the First Office Action issued in copending Application No. 2006-10087750.2 mailed Feb. 15, 2008, and English language translation thereof.

Tezuka et al., "Dislocation-free relaxed SiGe-on-insulator mesa structures fabricated by high-temperature oxidation," Journal of Applied Physics (Dec. 15, 2003), 94:7553-59.

Tezuka et al., "A Novel Fabrication Technique of Ultrathin and Relaxed SiGe Buffer layers with High Ge Fraction for Sub-100 nm Strained Silicon-on-Insulator MOSFETs," Jpn. J. Appl. Phys. (Apr. 2001), 40:2866-74.

Notification for Reasons for Rejection mailed on Jul. 29, 2008, by the Japanese Patent Office in copending Application No. 2005-160525 and English language translation thereof.

* cited by examiner

*Primary Examiner*—Steven Loke
*Assistant Examiner*—Suberr Chi
(74) *Attorney, Agent, or Firm*—Finnegan, Henderson, Farabow, Garrett & Dunner, L.L.P.

(57) ABSTRACT

A semiconductor device includes an n-channel MIS transistor and a p-channel MIS transistor on a semiconductor layer formed on an insulating layer, in which the channel of the n-channel MIS transistor is formed of a strained Si layer having biaxial tensile strain and the channel of the p-channel MIS transistor is formed of a strained SiGe layer having uniaxial compression strain in the channel length direction.

4 Claims, 7 Drawing Sheets

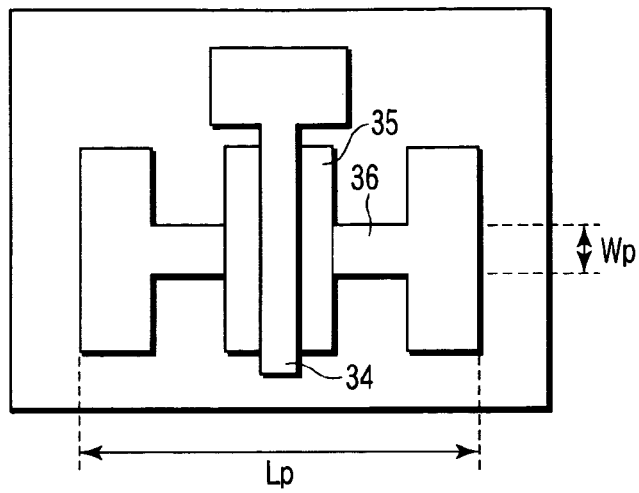
F I G. 4A
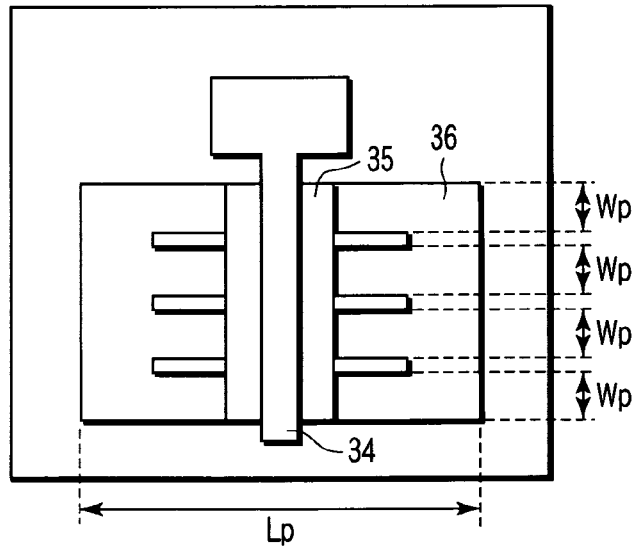
F I G. 4B
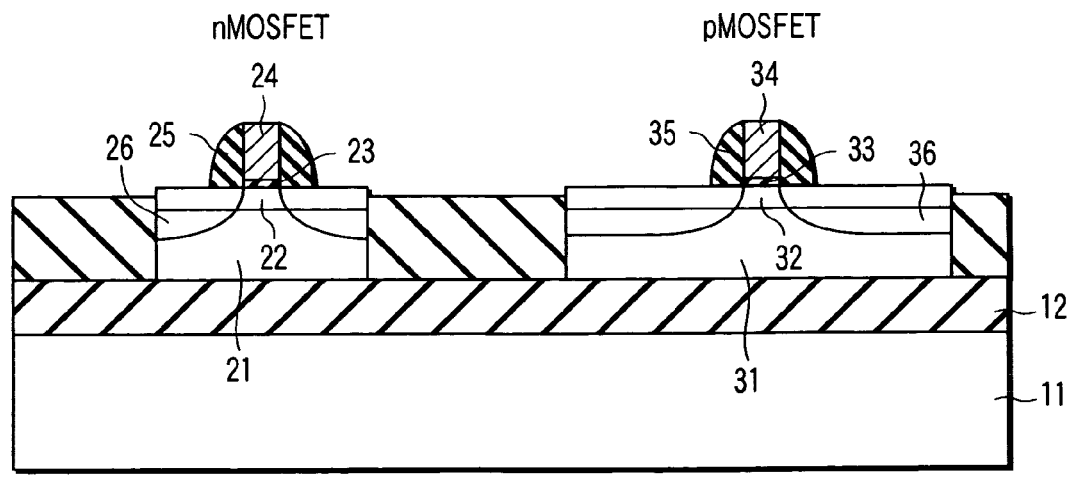
F I G. 5

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-160525, filed May 31, 2005, the entire contents of which are incorporated herein by reference.

BACKGROUND OF THE INVENTION

1. Field of the Invention

The present invention relates to a semiconductor device including an n-channel MIS (metal-insulator semiconductor) transistor and a p-channel MIS transistor formed on the same substrate, as well as a method of manufacturing such a device.

2. Description of the Related Art

The drastic improvements of the performance of CMOS circuits have been achieved by micro-fabricating MOSFET based on the scaling rule. However, at present, where there has been a breakthrough where the gate length is 50 nm or less, various problems innate to the micro-fabrication are becoming prominent. Under these circumstances, it is essential for a further improvement of the performance of the CMOS circuit to create a technique of increasing the mobility of channels. In order to enhance the mobility of channels, there have been proposed a method of applying strain to Si that forms a channel or a method of using SiGe (or Ge) for a channel.

The method of applying strain to Si is mainly divided into two categories, one is that Si is formed by epitaxial growth on lattice-relaxed SiGe, and another is that a nitride film that creates stress is deposited on a transistor. The former is a method in which biaxial tensile strain is applied to Si, whereas the latter is a method in which uniaxial tensile strain is applied in the gate length direction. Both of these methods are effective for increasing the mobility of nMOSFET. However, the above-described strain application entails such a drawback that the increase in mobility of pMOSFET is small or substantially none.

There have been attempts over a long period to increase the mobility of pMOSFET by using biaxial compression-strained SiGe (or Ge) for the channel material. Based on this idea, there has been proposed a CMOS structure in which strained Si is used for the channel of nMOSFET and strained SiGe is used for the channel of pMOSFET (in Jpn. Pat. Appln. KOKAI Publication No. 2001-160594). However, with a SiGe material having biaxial compression strain, a sufficiently increase in mobility, for example, about two times as much, cannot be obtained if the Ge composition is less than 50%. Further, the use of a high Ge-concentration channel poses a number of problems in terms of separation formation from that of nMOSFET, crystal defect, leak current, interfacial characteristics of gate insulation film, compatibility with an already-existing Si-LSI process, etc.

As described above, the conventional CMOS structure in which the mobility is improved by lattice strain, still entails such a drawback that a sufficient increase in mobility cannot be obtained for both of the n and p transistors unless the Ge composition is increased and large strain is applied.

BRIEF SUMMARY OF THE INVENTION

According to an aspect of the present invention, there is provided a semiconductor device comprising:
an insulating film;
a strained Si layer formed on the insulating film and having a biaxial tensile strain;
a strained SiGe layer formed on the insulating film and having a uniaxial compression strain;
an n-channel MIS transistor formed on the strained Si layer; and
a p-channel MIS transistor formed on the strained SiGe layer, a channel length direction of the p-channel MIS transistor being the same as the uniaxial direction of the compression strain.

According to another aspect of the present invention, there is provided a semiconductor device comprising:
an insulating film;
a first strained Si layer formed on the insulating film and having a biaxial tensile strain;
a second strained Si layer formed on the insulating film and having a uniaxial tensile strain;
an n-channel MIS transistor formed on the first strained Si layer; and
a p-channel MIS transistor formed on the second strained Si layer, a channel width direction of the p-channel MIS transistor being the same as the uniaxial direction of the tensile strain.

According to still another aspect of the present invention, there is provided a semiconductor device comprising:
an insulating film;
a strained Si layer formed on the insulating film and having a uniaxial tensile strain;
a strained SiGe layer formed on the insulating film and having a uniaxial compression strain;
an n-channel MIS transistor formed on the strained Si layer, a channel width direction of the n-channel MIS transistor being the same as the uniaxia direction of the tensile strain; and
a p-channel MIS transistor formed on the strained SiGe layer, a channel length direction of the p-channel MIS transistor being the same as the uniaxial direction of the compression strain.

According to still another aspect of the present invention, there is provided a semiconductor device comprising:
an insulating film;
a first strained Si layer formed on the insulating film and having a uniaxial tensile strain;
a second strained Si layer formed on the insulating film and having a uniaxial tensile strain;
an n-channel MIS transistor formed on the first strained Si layer, a channel width direction of the n-channel MIS transistor being the same as the uniaxial direction of the tensile strain; and
a p-channel MIS transistor formed on the second strained Si layer, a channel width direction of the p-channel MIS transistor being the same as the uniaxial direction of the tensile strain.

According to still another aspect of the present invention, there is provided a method of manufacturing a semiconductor device, comprising:
forming a SiGe layer while being biaxially compression-strained on an insulating film;
selectively etching a surrounding of a region of the SiGe layer, in which an n-channel MIS transistor is to be formed, thereby leaving a portion of the SiGe layer in an island fashion in the n-channel MIS transistor forming region;

heat-treating the island-like SiGe layer portion left in the n-channel MIS transistor forming region, thereby relaxing lattice strain of the SiGe layer portion;

selectively etching a surrounding of a region of the SiGe layer, in which a p-channel MIS transistor is to be formed, thereby leaving a portion of the SiGe layer in an island fashion to be long in a channel length direction and short in a channel width direction, thereby relaxing lattice strain in the channel width direction and maintaining the uniaxial compression strain in a channel length direction in the SiGe layer;

forming a Si layer on the SiGe layer portion in which the lattice strain is relaxed in the n-channel MIS transistor forming region, thereby forming a strained Si layer having biaxial tensile strain; and forming an n-channel MIS transistor in the strained Si layer, and forming a p-channel MIS transistor on the SiGe layer portion having uniaxial compression strain, in the p-channel MIS transistor forming region.

According to still another aspect of the present invention, there is provided a method of manufacturing a semiconductor device, comprising:

forming a SiGe layer while being biaxially compression-strained on an insulating film;

selectively etching a surrounding of a region of the SiGe layer, in which an n-channel MIS transistor is to be formed, thereby leaving a portion of the SiGe layer in an island fashion in the n-channel MIS transistor forming region;

heat-treating the island-like SiGe layer portion left in the n-channel MIS transistor forming region, thereby relaxing lattice strain of the SiGe layer portion;

selectively etching a surrounding of a region of the SiGe layer, in which a p-channel MIS transistor is to be formed, thereby leaving a portion of the SiGe layer in an island fashion to be long in a channel length direction and short in a channel width direction, thereby relaxing lattice strain in the channel width direction and maintaining the uniaxial compression strain in a channel length direction in the SiGe layer;

forming a Si layer on the SiGe layer portion in which the lattice strain is relaxed in the n-channel MIS transistor forming region, thereby forming a first strained Si layer having biaxial tensile strain;

forming a Si layer on the SiGe layer portion having the uniaxial compression strain in the p-channel MIS transistor forming region, thereby forming a second strained Si layer having uniaxial tensile strain in a channel width direction; and forming an n-channel MIS transistor in the first strained Si layer, and forming a p-channel MIS transistor on the second strained Si layer.

According to still another aspect of the present invention, there is provided a method of manufacturing a semiconductor device, comprising:

forming a SiGe layer while being biaxially compression-strained on an insulating film;

selectively etching the SiGe layer, thereby leaving a portion of the SiGe layer in an island fashion in each of the n-channel MIS transistor forming region and p-channel MIS transistor forming region, to be long in a channel length direction and short in a channel width direction, thereby relaxing lattice strain in the channel width direction and maintaining the uniaxial compression strain in a channel length direction in the SiGe layer;

forming a Si layer on the SiGe layer portion having the uniaxial compression strain in the n-channel MIS transistor forming region, thereby forming a strained Si layer having uniaxial tensile strain in a channel width direction; and forming an n-channel MIS transistor in the strained Si layer of the n-channel MIS transistor forming region, and forming a p-channel MIS transistor on the strained SiGe layer having the uniaxial compression strain in the p-channel MIS transistor forming region.

According to still another aspect of the present invention, there is provided a method of manufacturing a semiconductor device, comprising:

forming a SiGe layer while being two-axially compression-strained on an insulating film;

selectively etching the SiGe layer, thereby leaving a portion of the SiGe layer in an island fashion in each of the n-channel MIS transistor forming region and p-channel MIS transistor forming region, to be long in a channel length direction and short in a channel width direction, thereby relaxing lattice strain in the channel width direction and maintaining the uniaxial compression strain in a channel length direction in the SiGe layer;

forming a Si layer on the SiGe layer portion having the uniaxial compression strain in each of the n-channel MIS transistor forming region and the p-channel MIS transistor forming region, thereby forming a strained Si layer having uniaxial tensile strain in a channel width direction; and forming an n-channel MIS transistor in the strained Si layer of the n-channel MIS transistor forming region, and forming a p-channel MIS transistor on the strained Si layer of the p-channel MIS transistor forming region.

BRIEF DESCRIPTION OF THE SEVERAL VIEWS OF THE DRAWING

FIGS. 4A and 4B each is a plan view showing different versions from that of the first embodiment;

FIG. 5 is a cross sectional view showing a brief structure of a CMOS-type semiconductor device according to the second embodiment;

DETAILED DESCRIPTION OF THE INVENTION

The present invention will now be described in detail with reference to accompanying drawings.

First Embodiment

Figure 1:
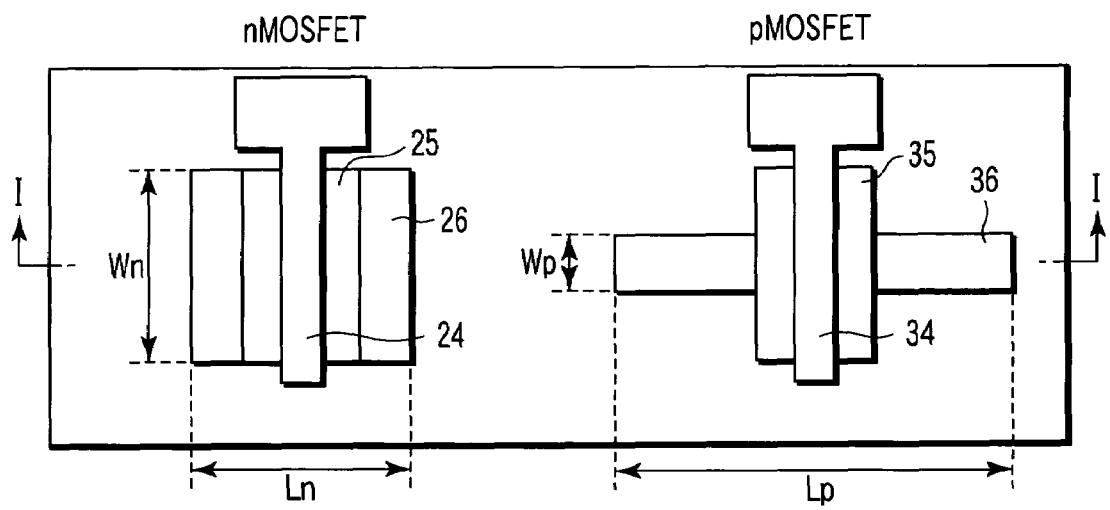
FIG. 1 is a plan view showing a brief structure of a CMOS-type semiconductor device according to the first embodiment.
Figure 2:
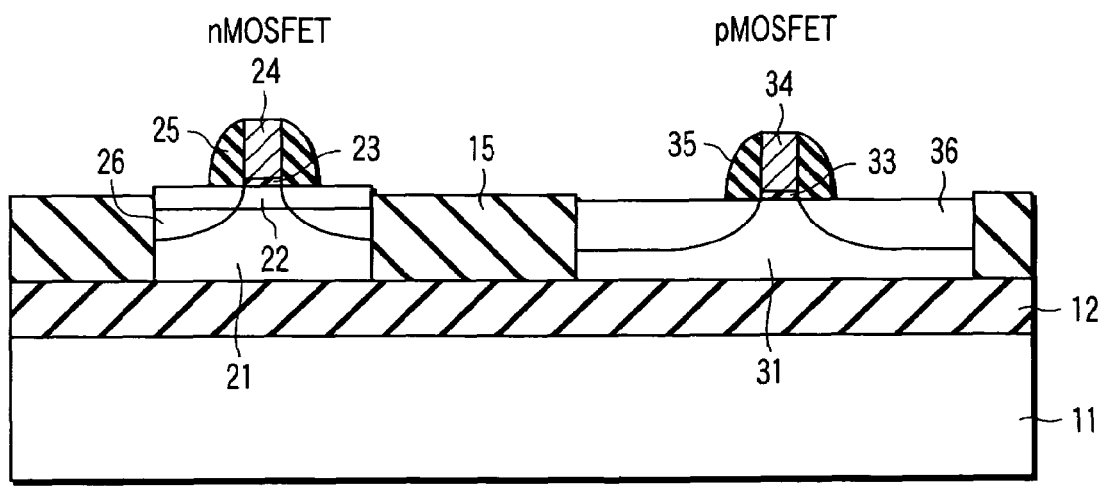
FIG. 2 is a cross sectional view showing a brief structure of the CMOS-type semiconductor device according to the first embodiment.

FIGS. 1 and 2 are diagrams showing a brief structure of a semiconductor device according to the first embodiment of the present invention. FIG. 1 is a plan view of the device, and FIG. 2 is a cross sectional view taken along an arrow I-I shown in FIG. 2.

As shown in these figures, a Si oxide film (embedded insulating layer) 12 is formed on a Si substrate 11. A lattice-relaxed SiGe layer 21 is formed on a part of the Si oxide film 12, and a strained Si layer 22 is formed on the SiGe layer 21. An nMOSFET is formed on the strained Si layer 22. That is, a gate electrode 24 is formed via a gate insulating film 23 on the strained Si layer 22. A gate sidewall insulating film 25 is formed on each of the sidewalls of the gate electrode 24, and further a source-drain region 26 is formed on the strained Si layer 22.

A strained SiGe layer 31 is formed on a part of the Si oxide film 12 to interpose an element separation insulating film 15 between the layer 31 itself and the SiGe layer 21. Further, a pMOSFET is formed on the strained SiGe layer 31. That is, a gate electrode 34 is formed via a gate insulating film 33 on the strained SiGe layer 31. A gate sidewall insulating film 35 is formed on each of the sidewalls of the gate electrode 34, and further a source-drain region 36 is formed on the strained SiGe layer 31.

A channel of the nMOSFET is formed of the strained Si layer 22 having biaxial tensile strain and formed by epitaxial growth on the lattice-relaxed SiGe layer 21. A channel of the pMOSFET is formed of the strained SiGe layer 31 having uniaxial compression strain. As shown in the plan view of FIG. 1, the element region of the pMOSFET is characterized in that a length Lp of the element region is longer than a channel width Wp. Here, the channel width Wp is set to 5 µm or less. On the other hand, a channel width Wn of the element region of the nMOSFET and a length Ln of the element region are both set to 5 µm or less. It should be noted that length Lp of the element region is set to 10 µm or more.

The gate insulating films 23 and 33 may be made of $SiO_2$ or an insulating film material (high dielectric insulating film) having a dielectric constant higher than that of $SiO_2$. Examples of this material are $Si_3N_4$, $Al_2O_3$, $Ta_2O_3$, $TiO_2$, $La_2O_5$, $CeO_2$, $ZrO_2$, $HfO_2$, $SrTiO_3$ and $Pr_2O_3$. Alternatively, materials prepared by mixing metal ion to a silicon oxide, such as Zi silicate or Hf silicate, or a combination of these materials are effective materials as well. Further, for the gate electrodes 24 and 34, it suffices if necessary materials are appropriately selected and used depending on the generation of the transistor, and examples of the materials are Si, SiGe, silicide, germano-silicide and various types of metals. Germanosilicide or silicide can be used for the source-drain regions 26 and 36.

It should be noted that it is alternatively possible to take the so-called elevate source-drain structure, in which the electrode is formed after forming a Si layer by epitaxial growth on the source-drain region, although it is not shown in this embodiment. This structure is effective for the decrease in parasitic resistance and the suppression of short channel effects.

The procedure of manufacture of a CMOS structure according to this embodiment will now be described with reference to FIGS. 3A to 3E, which briefly show main steps of the manufacture.

Figure 3A:
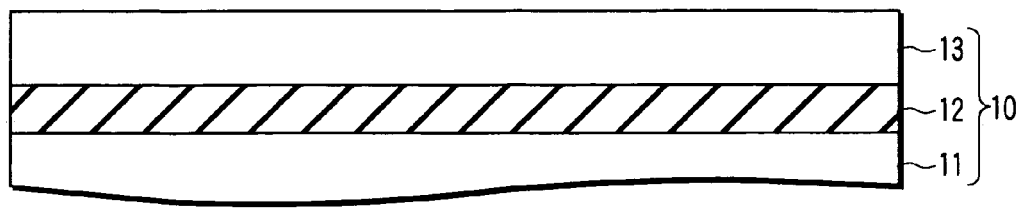
FIGS. 3A to 3E each is a cross sectional view showing a step in manufacture of the CMOS-type semiconductor device according to the first embodiment.

First, as shown in FIG. 3A, the embedded oxide film 12 is formed on the Si substrate 11, a Si layer (not shown) is formed on the embedded oxide film 12, and thus a SOI (Si on Insulator) substrate 10 is prepared. A SiGe layer 13 is grown on the SOI substrate 10 while the layer 13 is strained by biaxial compression and thus a strained SGOI (Si—Ge on Insulator) substrate is manufactured.

A strained SGOI substrate can be formed by utilizing the oxidation condensation method, which should be carried out after the epitaxial growth of SiGe on a SOI substrate. (See T. Tezuka, "A Novel Fabrication Technique of Ultrathin and Relaxed SiGe Buffer Layers with High Ge Fraction for Sub-100 nm Strained Silicon-on-Insulator MOSFETs", Japanese Journal of Applied Physics, Vol. 40, p 2866-2874, 2001.) Alternatively, a composite SGOI substrate may be used. The method of manufacturing a strained SGOI substrate is not particularly limited, but the SiGe layer 13 should be strained by biaxial compression.

Figure 3B:
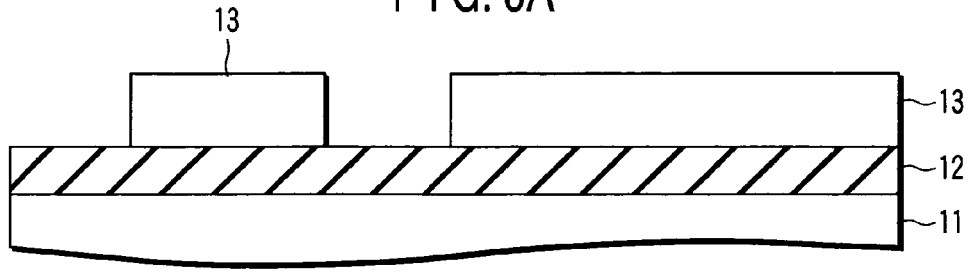

Next, as shown in FIG. 3B, the element region of the nMOSFET is mesa processed by a conventional lithography process. More specifically, the region of the SiGe layer 13, which is located around the element region of the nMOSFET, is etched.

Figure 3C:
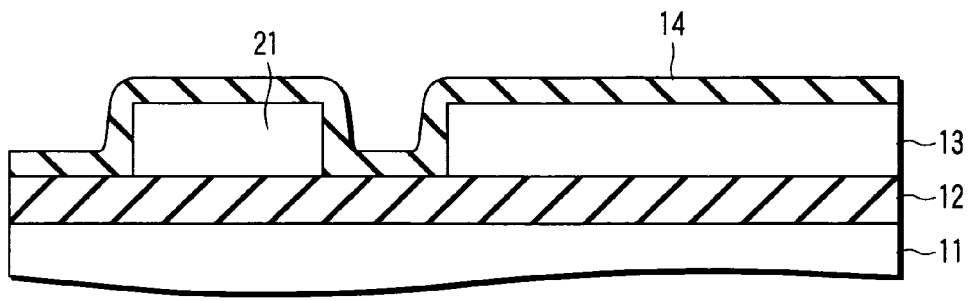

Then, as shown in FIG. 3C, the surface and side surfaces of the Si layer 13 are protected by a nitride film 14, and then the resultant is subjected to heat treatment at a temperature of 1000 to 1300° C. for 0.5 hours or longer. The mesa-processed region is likely to be relaxed by the heat treatment, and therefore the SGOI of only the nMOSFET region is lattice-relaxed in this step. Thus, a relaxed SiGe layer 21 can be obtained. During this relaxation, dislocations are not introduced. (See T. Tezuka et al., "Dislocation-free relaxed SiGe-on-insulation mesa structures fabricated by high-temperature oxidation", Journal of Applied Physics, 94, p7553-7559 (2003).) Here, it is possible to carry out ion injection of H, He, B, N, Ar, Si, Ge, Xe. etc. before the heat treatment for the promotion of relaxation by introducing point defects.

Figure 3D:
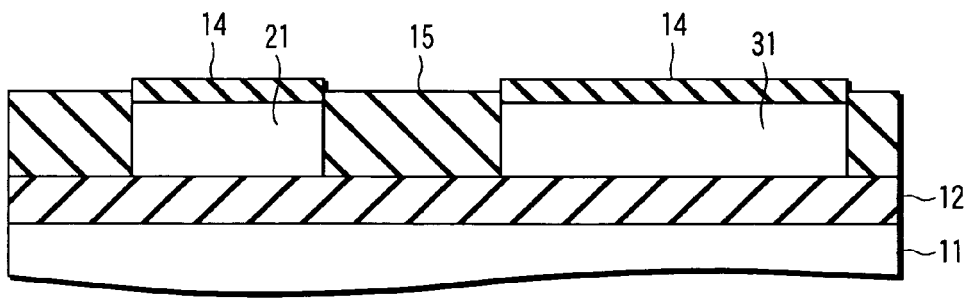

Next, as shown in FIG. 3D, the element region of the pMOSFET is subjected to the mesa process. Here, the dimension in the channel width direction should be made sufficiently short (for example, 2 µm), whereas the dimension in the channel length direction should be made sufficiently long (for example, 10 µm). After that, an ordinary STI (shallow trench isolation) step is carried out. It is possible here to carry out heat treatment once again while the nitride film 14 still remains on the surface after the STI. As undergoing the above-described process with the above-mentioned shape, a uniaxial compression strained SiGe layer 31 can be formed, in which the strain is relaxed only in the channel width direction and the strain in the channel length direction remains.

It should be noted here that as the channel width Wp of the pMOSFET region is shorter, it is more advantageous to relax the lattice of SiGe layer. Specifically, when the value of Wp is 5 µm or less, the lattice strain can be easily relaxed. On the other hand, when length Lp of the element region is 10 µm or more, the lattice stain can be surely maintained. Further, in the nMOSFET region, the lattice is relaxed by the heat treatment after protecting the SiGE layer with the nitride film 14. Here, in order to relax the lattice in a more certain way, it is desirable that the channel width Wn and the length Ln of the element region should be 5 µm or less.

Figure 3E:
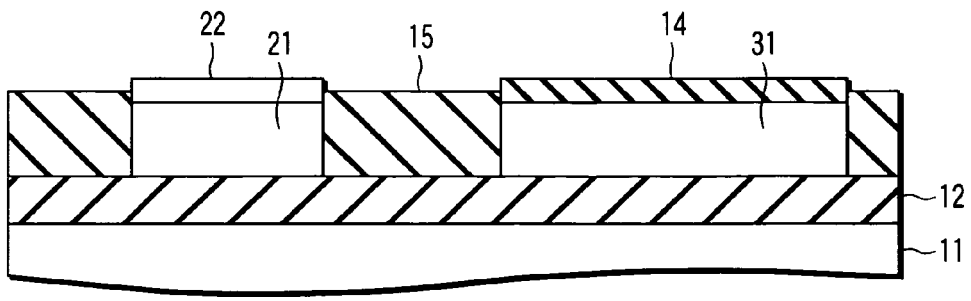

Next, as shown in FIG. 3E, the nitride film 14 of the nMOSFET region is detached and a strained Si layer 22 is formed on the SiGe layer 21 by selective epitaxial growth using CVD. The SGOI of the nMOSFET region is relaxed biaxially and therefore a strained Si layer 22 having a biaxial tensile strain can be formed.

That is, the strained Si layer 22 having biaxial tensile strain is formed on the nMOSFET region, and the strained SiGe layer 31 having uniaxial tensile strain is formed on the pMOSFET region.

The following steps are carried out in accordance with a general CMOS process and therefore there are no illustrations provided for these general steps. More specifically, an nMOSFET is formed on the strained Si layer 22 and a pMOSFET is formed on the strained SiGe layer 31, and thus a complementary MOSFET such as shown in FIGS. 1 and 2 is completed.

As described above, according to this embodiment, the strain mode of each of the pMOSFET and nMOSFET is optimized independently, and therefore it is possible to increase the mobility of each of the MOSFETS effectively with a relatively small strain. In this manner, the mobility can be improved in both of n and p MOS transistors without using a high Ge concentration channel. For example, for a relatively small stain in which the Ge composition is 20%, the mobility can be increased about twice as high in both transistors. Especially, in the case of a pMOSFET, the mobility can only be increased slightly by the conventional biaxial strain. According to this embodiment, in which uniaxial strain is applied, the mobility can be effective increased.

Further, according to this embodiment, a great increase in mobility can be obtained by a low Ge concentration, better characteristics than those of the conventional technique can be achieved in terms of separation formation of nMOSFET and pMOSFET from each other, crystal defect, leak current, interfacial characteristics of gate insulation film, compatibility with an already-existing Si-LSI process, etc. Furthermore, the SGOI substrate formed in this embodiment is free of dislocations, and therefore the leak current can be further decreased and the reliability of the product can be improved.

It should be noted that as can be understood from FIG. 1, the pMOSFET region contains a region of no use, which is not used as a part of the element. In consideration of this, it is possible to increase the width of the element region of the SiGe layer 31 in the area other than the channel region as shown in FIG. 4A. Further, it is alternatively possible that a plurality of channels with narrow widths are formed in parallel with other as shown in FIG. 4B.

Second Embodiment

FIG. 5 is a cross sectional view showing a brief structure of a CMOS-type semiconductor device according to the second embodiment of the present invention. The same structural elements as those shown in FIG. 2 are designated by the same reference numerals, and the detailed explanations are not repeated here. The plan view of this embodiment is substantially the same as that of FIG. 1 described above, and therefore it is omitted.

The point of this embodiment, which is different from that of the first embodiment is that the pMOSFET is formed not by the strained SiGe layer 31 having uniaxial compression strain in the channel length direction, but by the strained Si layer 32 having uniaxial tensile strain in the channel width direction.

As in the case of the first embodiment, the channel of the nMOSFET is a strained Si layer 22 having biaxial tensile strain and formed by epitaxial growth on the lattice relaxed SiGe layer 21. On the other hand, the pMOSFET has a structure in which the Si layer 32 is formed by epitaxial growth on the strained SiGe layer 31 having uniaxial compression strain in the channel length direction. With this structure, uniaxial tensile strain is applied to the Si layer 32 in its channel width direction. Therefore, the channel of the pMOSFET is formed of the strained Si layer 32 having uniaxial tensile strain.

The length of the element region and the channel width of each of the nMOSFET and pMOSFET are defined in the same manner as in the first embodiment.

The procedure of manufacture of a CMOS structure according to this embodiment will now be described with reference to FIGS. 3 and 6.

The manufacturing procedure of this embodiment is the same as that of the first embodiment up to the step shown in FIG. 3D illustrated in connection with the first embodiment. That is, the element region of the nMOSFET and the element region of the pMOSFET are manufactured one after another. Then, the lattice-relaxed SiGe layer 21 is formed on the nMOSFET region and the stained SiGe layer 31 having uniaxial compression strain is formed on the pMOSFET region.

Figure 6:
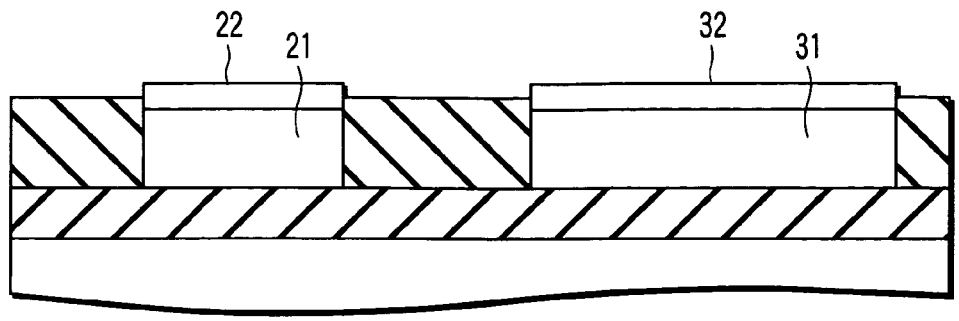
FIG. 6 is a cross sectional view showing a step in manufacture of the CMOS-type semiconductor device according to the second embodiment.

Next, as shown in FIG. 6, after the nitride film 14 formed on the regions of both nMOSFET and pMOSFET is removed, the Si layers 22 and 32 are formed by epitaxial growth on the SiGe layers 21 and 31, respectively using the CVD method. Here, the lattice of the SiGe layer 21 is relaxed and therefore biaxial tensile strain occurs in the Si layer 22 formed thereon. On the other hand, the SiGe layer 31 has uniaxial compression strain in the channel length direction and the lattice thereof is relaxed in the channel width direction. Therefore, uniaxial tensile strain occurs in the Si layer 32 formed thereon, in its channel width direction. In this manner, an element region of a CMOS structure is formed of the biaxial tensile strain Si-nMOSFET and uniaxial tensile strain Si-pMOSFET.

After the STI, the formation of a CMOS circuit is carried out by a general CMOS process, and thus the structure shown in FIG. 5 is obtained.

According to this embodiment, the strain mode of each of the pMOSFET and nMOSFET is optimized independently, and therefore it is possible to increase the mobility of each of the MOSFETS effectively with a relatively small strain. In this manner, a similar advantageous effect to that of the first embodiment can be obtained.

It should be noted that it is possible to remodel pMOSFET as can be seen in FIG. 4A or 4B.

Third Embodiment

Figure 7:
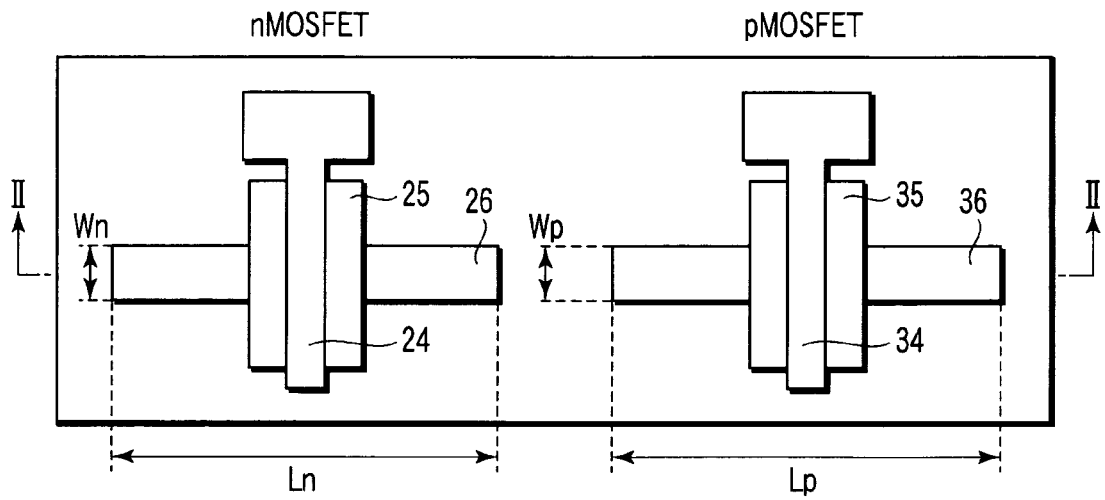
FIG. 7 is a plan view showing a brief structure of a CMOS-type semiconductor device according to the third embodiment.
Figure 8:
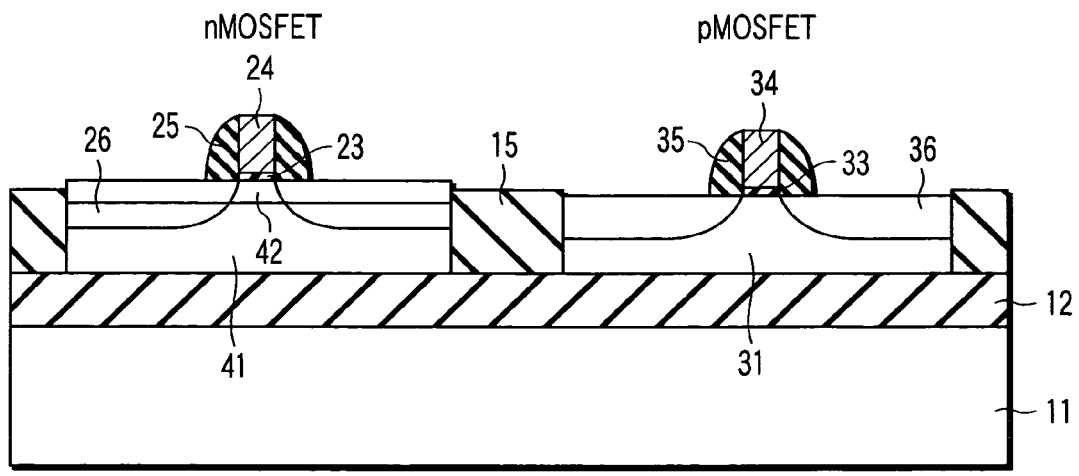
FIG. 8 is a cross sectional view showing a brief structure of the CMOS-type semiconductor device according to the third embodiment.

FIGS. 7 and 8 are diagrams showing a brief structure of a semiconductor device according to the third embodiment of the present invention. FIG. 7 is a plan view of the device, and FIG. 8 is a cross sectional view taken along an arrow I-I shown in FIG. 7. The same structural elements as those shown in FIGS. 1 and 2 are designated by the same reference numerals, and the detailed explanations are not repeated here.

The point of this embodiment, which is different from that of the first embodiment is that the nMOSFET is formed not by the strained Si layer having biaxial tensile strain, but by the strained Si layer 42 having uniaxial tensile strain in the channel width direction.

That is, the channel of the nMOSFET is made of a strained Si layer 42 having uniaxial tensile strain and formed by epitaxial growth on the strained SiGe layer 41 having uniaxial compression strain. On the other hand, the channel of the pMOSFET is formed of the strained SiGe layer 31 having uniaxial compression strain as in the first embodiment.

As shown in the plan view of FIG. 7, the element regions of the nMOSFET and pMOSFET are both characterized in that the length Ln and Lp of the respective element regions are longer than the channel widths Wn and Wp, respectively, and the channel widths Wn and Wp are set to 5 µm or less. The gate insulating film, gate electrode, source-drain regions are similar to those described in the first embodiment.

The procedure of manufacture of a CMOS structure according to this embodiment will now be described with reference to FIGS. 9A to 9D.

Figure 9A:
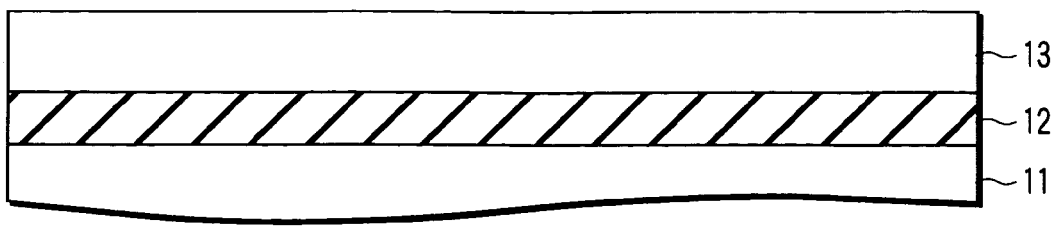
FIGS. 9A to 9D each is a cross sectional view showing a step in manufacture of the CMOS-type semiconductor device according to the third embodiment.

First, as shown in FIG. 9A, a strained SGOI substrate is manufactured in a similar manner to that of the first embodiment.

Figure 9B:
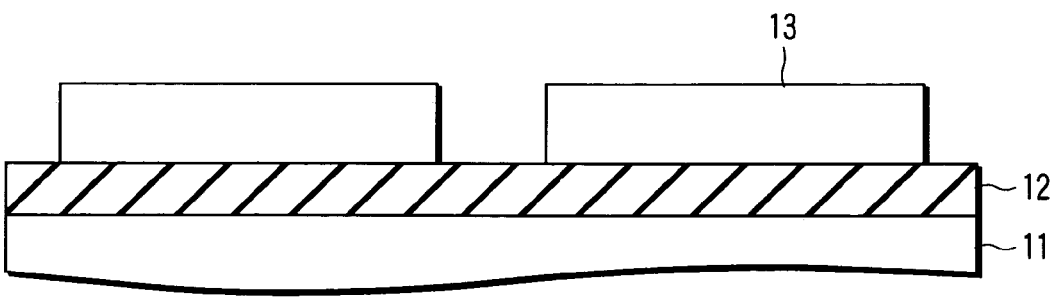
Figure 9C:
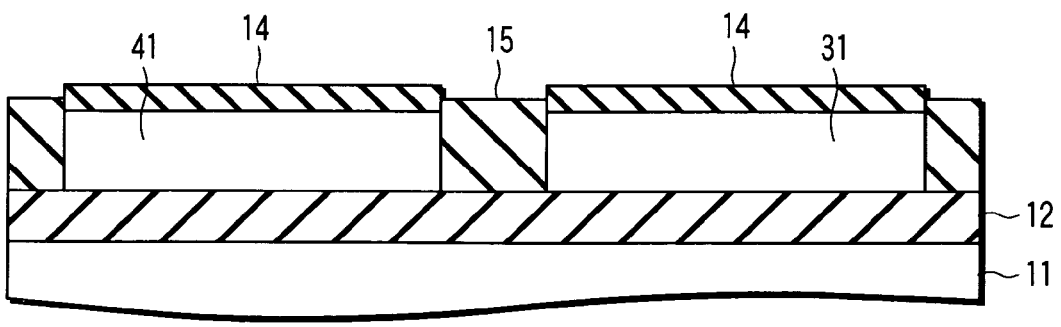
Figure 9D:
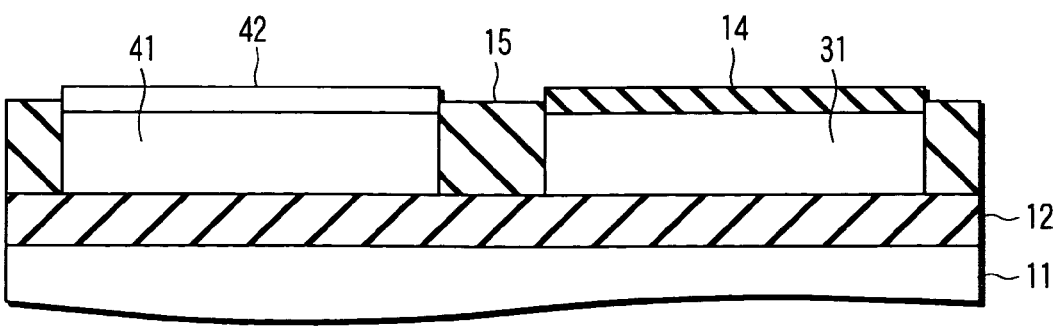

Next, as shown in FIG. 9B, the element regions of the nMOSFET and pMOSFET are subjected to mesa process at the same time and the STI process is carried out. Here, the element regions are made in such a manner that they are formed long in the channel length direction and short in the channel width direction. After the STI, it is possible here to carry out heat treatment while the nitride film 14 still remains on the surface as shown in FIG. 9C. As undergoing the above-described process with the above-mentioned shape, strained SiGe layers 31 and 41 having uniaxial compression strain is formed, in which the lattice strain is relaxed only in the channel width direction and the strain in the channel length direction remains.

Figure 11:
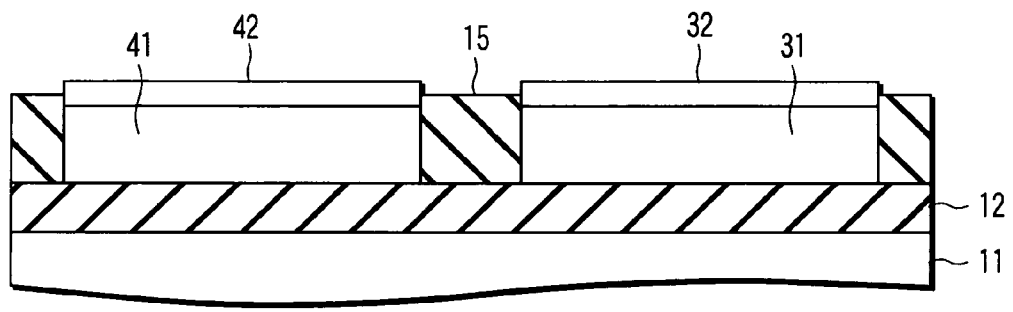
FIG. 11 is a cross sectional view showing a step in manufacture of the CMOS-type semiconductor device according to the fourth embodiment.

Next, as shown in FIG. 11, the nitride film 14 of the nMOSFET region is detached and a strained Si layer 42 is formed on the strained SiGe layer 41 by selective epitaxial growth using CVD. The SiGe layer 41 has uniaxial compression strain in the channel length direction and the lattice thereof is relaxed in the channel width direction. Therefore, uniaxial tensile strain occurs in the Si layer 42 formed thereon, in its channel width direction. In this manner, an element region of a CMOS structure is formed of the uniaxial tensile strain Si-nMOSFET and uniaxial tensile strain SiGe-pMOSFET.

After the STI, the formation of a CMOS circuit is carried out by a general CMOS process, and thus the structure shown in FIGS. 7 and 8 is obtained.

According to this embodiment, the strain mode of each of the pMOSFET and nMOSFET is optimized independently, and therefore it is possible to increase the mobility of each of the MOSFETS effectively with a relatively small strain. In this manner, a similar advantageous effect to that of the first embodiment can be obtained.

It should be noted that it is possible to remodel not only the pMOSFET but also nMOSFET as can be seen in FIG. 4A or 4B.

Fourth Embodiment

Figure 10:
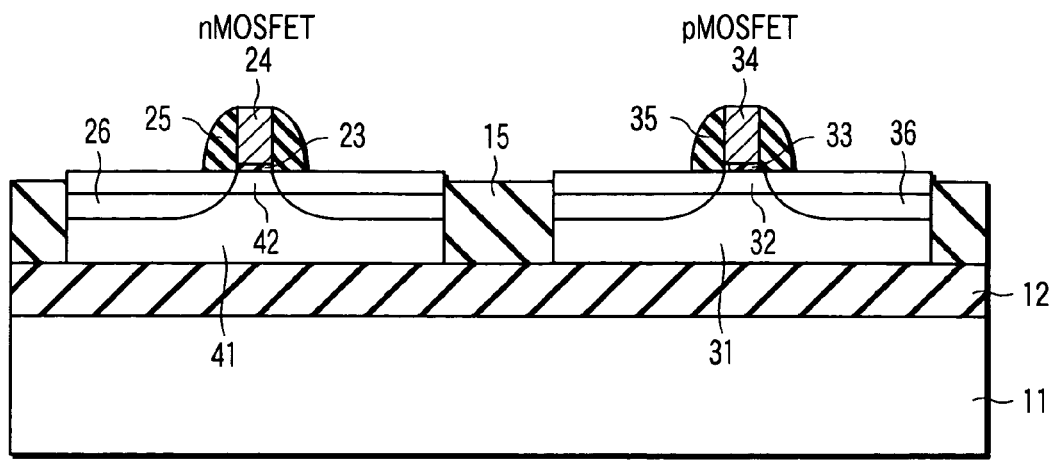
FIG. 10 is a cross sectional view showing a brief structure of a CMOS-type semiconductor device according to the fourth embodiment.

FIG. 10 is a diagram showing a brief structure of a semiconductor device according to the fourth embodiment of the present invention. The same structural elements as those shown in FIG. 8 are designated by the same reference numerals, and the detailed explanations are not repeated here. The plan view of this embodiment is substantially the same as that of FIG. 7 described above, and therefore it is omitted.

The point of this embodiment, which is different from that of the third embodiment is that the pMOSFET is formed not by the strained SiGe layer 31 having uniaxial compression strain in the channel length direction, but by the strained Si layer 32 having uniaxial tensile strain in the channel width direction, as in the case of the second embodiment.

That is, the channels of the nMOSFET and pMOSFET are made of strained Si layers 42 and 43 having uniaxial tensile strain and formed by epitaxial growth on the strained SiGe layers 31 and 41 having uniaxial compression strain.

As shown in FIG. 7, the element regions of the nMOSFET and pMOSFET are both characterized in that the length Ln and Lp of the respective element regions are longer than the channel widths Wn and Wp, respectively, and the channel widths Wn and Wp are set to 5 µm or less. The gate insulating film, gate electrode, source-drain regions are similar to those described in the first embodiment.

The procedure of manufacture of a CMOS structure according to this embodiment will now be described with reference to FIGS. 9A to 9D and FIG. 11.

The manufacturing procedure of this embodiment is the same as that of the third embodiment up to the step shown in FIG. 9C described in connection with the third embodiment. Thus, the strained SiGe layers 41 and 31 having uniaxial compression strain are formed, in which the lattice strain is relaxed only in the channel width direction and the strain in the channel length direction remains.

Next, as shown in FIG. 11, the nitride film 14 of the both nMOSFET and pMOSFET regions are detached and a strained Si layer 42, 32 is formed on the strained SiGe layer 41, 31 by selective epitaxial growth using CVD. The SiGe layer 41 has uniaxial compression strain in the channel length direction and the lattice thereof is relaxed in the channel width direction. Therefore, uniaxial tensile strain occurs in the Si layer 42 formed thereon, in its channel width direction. In this manner, an element region of a CMOS structure is formed of the uniaxial tensile strain Si-nMOSFET and uniaxial tensile strain Si-pMOSFET.

After the STI, the formation of a CMOS circuit is carried out by a general CMOS process, and thus the structure shown in FIGS. 7 and 8 is obtained.

According to this embodiment, the strain mode of each of the pMOSFET and nMOSFET is optimized independently, and therefore it is possible to increase the mobility of each of the MOSFETS effectively with a relatively small strain. In this manner, a similar advantageous effect to that of the first embodiment can be obtained.

It should be noted that it is possible to remodel not only the pMOSFET but also nMOSFET as can be seen in FIG. 4A or 4B.

(Variations)

Figure 12:
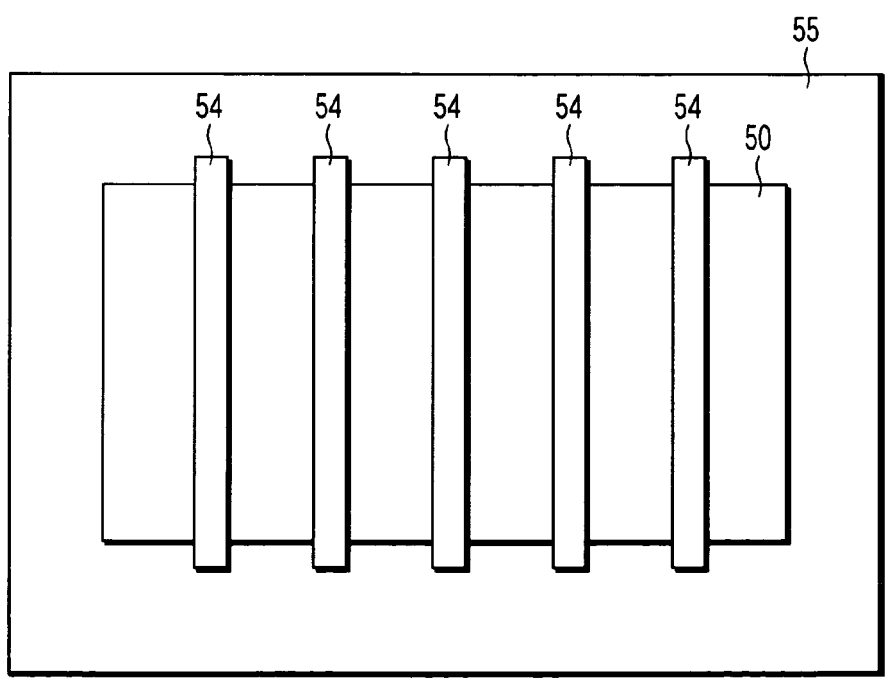
FIG. 12 is a plan view showing different versions of the present invention.

The present invention is not limited to the above-described embodiments. These embodiments are built on the premise that one MOSFET is formed in one element region; however the present invention is also applicable to such a case as shown in FIG. 12, that is, an integrated circuit in which a plurality of MOSFETS are formed within one element region in an array fashion. This figure illustrates an element region 50, a gate electrode 54 and an element separation insulating film 55.

The above-provided embodiments are directed to the cases of MOSFETs that employ oxide film as gate insulating films, but the present invention is also applicable to a MIS structure in which an insulating film other than oxide film is used as the gate insulating film. Further, the n-channel MISFET and p-channel MISFET may not necessarily be formed complementary, but the present invention can be applied to a structure in which an n-channel MISFET and a p-channel MISFET are formed on the same substrate.

Further, the MOSFET of the present invention may be of the so-called Fin type MOSFET or Tri-gate type MOSFET.

Figure 13A:
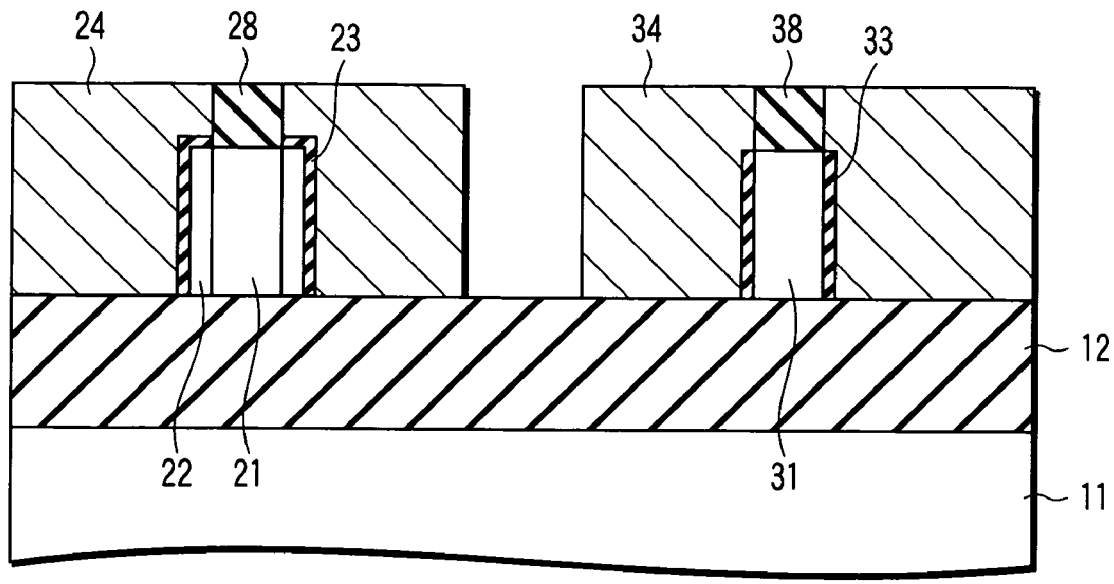
FIGS. 13A and 13B each is a cross sectional view showing a brief structure of a different version of the present invention.

FIG. 13A is a cross section showing a brief structure of a Fin type MOSFET, which is an application of the first embodiment of the present invention. The relaxed SiGe layer 21 and a cap layer 28 made of, for example, a silicon nitride film, are stacked on a part of the buried oxide film 12 on the support substrate 11. Further, the strained Si layer 22 is formed around the SiGe layer 21 by epitaxial growth. After that, the gate insulating film 23 and gate electrode 24 are formed, and thus a Fin type n MOSFET is formed. On the other hand, the uniaxial strained SiGe layer 31 and a cap layer 28 made of, for example, a silicon nitride film, are stacked on a part of the oxide film 12, and further, the gate insulating film 33 and gate electrode 34 are formed. Thus, a Fin type p MOSFET is formed.

Figure 13B:
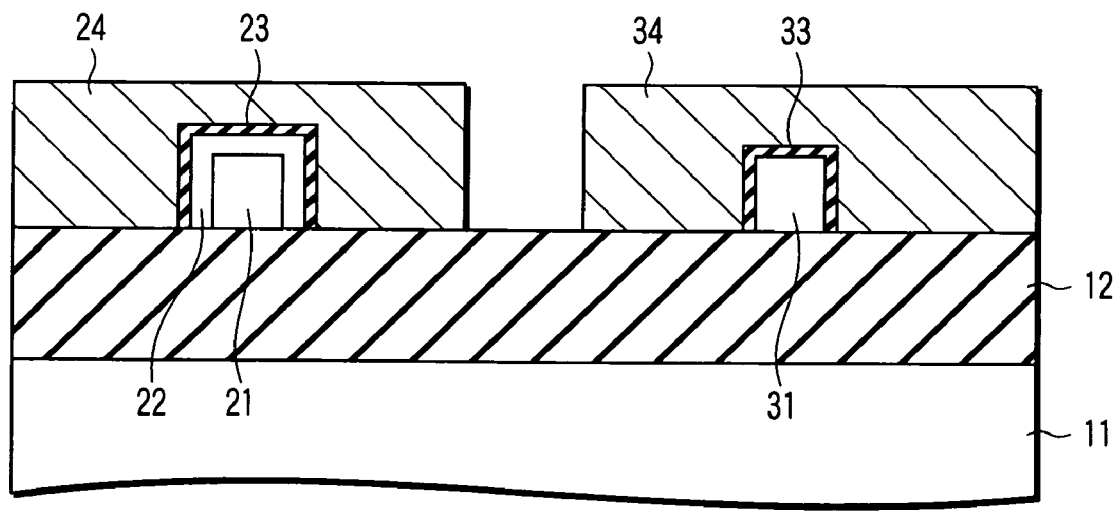

FIG. 13B is a cross section showing a brief structure of a Tri-gate type MOSFET, which is an application of the first embodiment of the present invention. As compared to that of FIG. 13A, the structure shown in FIG. 13B further includes the strained Si layer 22, gate insulating film 23 and gate electrode 24, which are formed on and above the strained SiGe layer 31. Further, the gate insulating film 23 and gate electrode 24 are formed on and above the SiGe layer 31.

In the Fin type MOSFET and Tri-gate MOSFET described above, the mobility improving effect of the present invention can be obtained. The orientation of the surface that gives rise to a channel can be changed by the arrangement of the element region, and thus even a higher current driving capability can be obtained. More specifically, the orientation of the side surface of the element region in which the channel of the Fin or Tri-gate channel is formed is changed by the arrangement of the element region with respect to the wafer which has a plane orientation of (100). That is, for example, the plane orientation of the side surface of the semiconductor layer which gives rise to the channel is set to (110). As a result, in the pMOSFET, the mobility can be improved or the diffusion of impurity can be suppressed. Thus, the parasitic resistance of the source-drain diffusion layer is decreased. In this manner, the current driving capability can be increased and the effect of further suppressing the short channel effect can be obtained. It should be noted here that the Fin type or Tri-gate type described above is applicable not only to the first embodiment, but also the other embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an insulating film;
a non-strained SiGe layer formed on the insulating film;
a strained Si layer formed on the non-strained SiGe layer, having a biaxial tensile strain;
a strained SiGe layer formed on the insulating film such that the strained SiGe layer is longer in a uniaxial direction parallel to a surface of the insulating film than in a direction parallel to the surface of the insulating film and perpendicular to the uniaxial direction, the strained SiGe layer having a uniaxial compression strain along the uniaxial direction;
an n-channel Metal-Insulator Semiconductor (MIS) transistor formed on the strained Si layer, and the strained Si layer used as a channel of the n-channel MIS transistor; and
a p-channel MIS transistor formed on the strained SiGe layer, the strained SiGe layer used as a channel of the p-channel MIS transistor, and the p-channel MIS transistor having a channel length direction the same as the uniaxial direction of the uniaxial compression strain.

2. The semiconductor device according to claim 1, wherein the non-strained SiGe layer of the n-channel MIS transistor has a length in the channel length direction of 5 μm or less and a length in the channel width direction of 5 μm or less, and the strained SiGe layer of the p-channel MIS transistor has a length in the channel width direction of 5 μm or less and a length in the channel length direction of 10 μm or more.

3. The semiconductor device according to claim 1, wherein the non-strained SiGe layer has a fin structure, the strained Si layer is formed on both side surfaces of the non-strained SiGe layer, and the strained SiGe layer has a fin structure and is longer in the uniaxial direction than in a direction perpendicular to both the surface of the insulating film and the uniaxial direction.

4. The semiconductor device according to claim 1, wherein the non-strained SiGe layer has a fin structure, the strained Si layer is formed on an upper surface and both side surfaces of the non-strained SiGe layer, and the strained SiGe layer has a fin structure and is longer in the uniaxial direction than in a direction perpendicular to both the surface of the insulating film and the uniaxial direction.

* * * * *